United States Patent
Liaw

(10) Patent No.: US 7,355,233 B2
(45) Date of Patent: Apr. 8, 2008

(54) APPARATUS AND METHOD FOR MULTIPLE-GATE SEMICONDUCTOR DEVICE WITH ANGLED SIDEWALLS

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 332 days.

(21) Appl. No.: 10/844,197

(22) Filed: May 12, 2004

(65) Prior Publication Data

US 2005/0253203 A1  Nov. 17, 2005

(51) Int. Cl.
*H01L 27/108* (2006.01)
*H01L 29/76* (2006.01)

(52) U.S. Cl. .................. 257/308; 257/365

(58) Field of Classification Search .............. None
See application file for complete search history.

(56) References Cited

U.S. PATENT DOCUMENTS

| | | | |
|---|---|---|---|
| 6,413,802 B1 | 7/2002 | Hu et al. | |
| 2004/0150029 A1* | 8/2004 | Lee | 257/308 |
| 2005/0040444 A1* | 2/2005 | Cohen | 257/288 |

OTHER PUBLICATIONS

Wu, Xusheng et al., "Impact of Non-Vertical Sidewall on Sub-50nm FinFET," IEEE, 2003.*
King, T-J., et al., "Advanced Materials and Processes for Nanometer-Scale FinFETs," University of California, Berkeley, date unknown, U.S.A.
Yu, B., et al., "FinFET Scaling to 10nm Gate Length," IEEE, 2002.
Kedzierski, J., et al., "A 20 nm Gate-Length Ultra-Thin Body p-MOSFET with Silicide Source/Drain," Superlattices and Microstructures, vol. 28, No. 5/6, 2000, pp. 445-452.
Krishnan, M.S., et al., "MOSFETs with 9 to 13 a Thick Gate Oxides," IEEE, 1999.
Zhang, S., et al., "A Novel Sub-50 nm Poly-Si Gate Patterning Technology," IEEE, 2001, pp. 841-843.
Barkhordarian, V., "Power MOSFET Basics," www.irf.com/technical-info/appnotes/mosfet.pdf, International Rectifier, date unknown.
American Microsemiconductor, "MOSFETS," http://www.americanmicrosemi.com/tutorials/mosfets.htm.
Chang, L., et al., "Moore's Law Lives On: Ultra-Thin Body SOI and FinFET CMOS Transistors Look to Continue Moore's Law for Many Years to Come," IEEE Circuits & Devices Magazine, Jan. 2003, pp. 35-42.
Tang, S.H., et al., "FinFET—A Quasi-Planar Double Gate MOSFET," ISSCC 2001 / Session 7 / Technology Directions: Advanced Technologies / 7.4, 2001 IEEE International Solid-State Circuits Conference, Feb. 6, 2001.
Huang, X., et al., "Sub-50 nm P-Channel FinFET," IEEE Transactions on Electron Devices, vol. 48, No. 5, May 2001, pp. 880-886.
Lindert, N., et al., "Sub-60-nm Quasi-Planar FinFETs Fabricated Using a Simplified Process," IEEE Electron Device Letters, vol. 22, No. 10, Oct. 2001, pp. 487-489.
Geppert, L., "The Amazing Vanishing Transistor Act," IEEE Spectrum, Oct. 2002, pp. 28-33.

* cited by examiner

Primary Examiner—Kiesha L. Rose
(74) Attorney, Agent, or Firm—Slater & Matsil, L.L.P.

(57) ABSTRACT

A multiple-gate transistor has an active region with a side that forms an interior angle with the base of the active region of less than 80°. A process for fabricating a FinFET includes the steps of etching a silicon-on-insulator wafer to form an active region, including the source, channel, and drain, with vertically angled sidewalls.

25 Claims, 6 Drawing Sheets

APPARATUS AND METHOD FOR MULTIPLE-GATE SEMICONDUCTOR DEVICE WITH ANGLED SIDEWALLS

TECHNICAL FIELD

The present invention relates generally to semiconductor devices, and more particularly to multiple gate semiconductor devices having an active region formed in an active layer mesa, the mesa having sloped sidewalls.

BACKGROUND

The dominant semiconductor technology used for the manufacture of ultra-large scale integrated (ULSI) circuits is the metal-oxide-semiconductor field effect transistor (MOSFET) technology. A MOSFET consists of source and drain regions separated by a channel region. Current flow between the source and drain through the channel is controlled by a voltage applied to a gate electrode lying adjacent to the channel and separated from it by an oxide dielectric. Traditionally, the source, channel and drain were embedded in a silicon substrate. The oxide dielectric was formed on the upper surface of the channel region, and the gate electrode was deposited on top of the oxide. Efforts to scale MOSFETs into the sub-50-nanometer (nm) regime have led to the development of vertical, multiple-gate MOSFETs, some of which are known as FinFETs, in which a thin, fin-shaped active region is formed which rises vertically from a substrate, typically a silicon on insulator (SOI) substrate (also sometimes known as a semiconductor on insulator substrate). The fin contains the source, channel and drain of the transistor.

FIG. 1 illustrates in plan view a typical (albeit idealized) prior art fin-FET structure 2. The structure 2 includes a first transistor 4 and a second transistor 6 formed in an active layer mesa 31. Transistors 4 and 6 share a common source/drain region 8. Transistor 4 also has source/drain region 10 and transistor 6 has source/drain region 12. One skilled in the art will recognize that transistors 4 and 6 can be of either n-type or p-type, respectively, and form a common CMOS transistor pair. Each transistor 4 and 6 has a channel region, not shown, which underlies gate electrodes 14 and 16, respectively. Also shown is similarly configured CMOS transistor pair 18 and 20 formed in active layer mesa 32 and sharing a common source/drain region 22. Transistor 18 also has source/drain region 24 and transistor 20 has source/drain region 26. Note that transistors 4 and 18 share a common gate electrode 14 and that transistors 6 and 20 share a common gate electrode 16.

The gate electrodes 14, 16 are formed over a gate dielectric, as is well known in the art. After formation of the gate dielectric layer (not shown), a polysilicon layer is typically blanket deposited over the entire structure and subsequently etched to form gate electrodes 14 and 16. FIG. 2a shows a cross sectional view of the structure along the cross section line shown as a-a in FIG. 1. As such, FIG. 2a illustrates details regarding transistors 4 and 18. Transistors 6 and 20 would have a similar cross section. As shown, mesas 31, 32 (in which transistors 4, 6 and 18, 20 are formed, respectively) have rectangular cross-sections and vertical sidewalls. A dielectric layer has been formed over the entire structure and patterned to form gate dielectric 28 for transistor 4 and gate dielectric 30 for transistor 6 (gate dielectrics for transistors 6 and 20 would be formed simultaneously). A polysilicon layer has been blanket deposited over the entire structure and has been patterned to form gate electrode 14 over transistors 4 and 18.

FIG. 2b illustrates the cross sectional view of the structure along the cross section line shown as b-b in FIG. 1. This view shows cross-sections of mesas 31 and 32 wherein are formed common source/drain regions 8 and 22, respectively, after the polysilicon layer has been patterned to form gate electrodes 14 and 16. Note that it is undesirable to have polysilicon remaining over the common source/drain regions (or over any regions that are not overlying the channel regions). Because of the vertical sidewalls of mesas 31 and 32, however, it is quite difficult to completely remove all of the polysilicon layer during the etching process. Polysilicon residual regions 34 often result from incomplete etching of the polysilicon layer from the mesa sidewalls, as is shown in FIG. 2b. One approach to overcoming the polysilicon residual regions is to over-etch the polysilicon layer. This over-etching, however, can damage the mesa region in which the source/drain regions will be formed, or may damage the underlying gate dielectric.

After the gate electrode has been etched, the source/drain regions are formed, typically by ion implantation, as is well known in the art. It is difficult to uniformly dope the sidewall portions of the source/drain regions without using an oblique implantation angle. However, when mesas (e.g., mesas 31 and 32) are closely spaced together, shadowing occurs wherein one mesa will cast a "shadow" on an adjacent mesa, thus preventing some of the desired ion implantation from occurring. Additionally, when mesas are formed orthogonally to one another, an oblique implantation angle could result in dopants being driven into the channel region, thus degrading device performance.

Another shortcoming of prior art structures is shown in FIG. 3. As shown, an inter-layer dielectric layer (ILD) is typically formed over the gate electrodes. This ILD layer is typically formed by e.g., LPCVD, PECVD, HDP, APCVD, or the like. The material typically comprises TEOS, BPTEOS, BPSG, PSG, SACVD, $O_3$ TEOS, PEOX, or combinations thereof. In some embodiments, the ILD could includes an $Si_3N_4$ or SiON contact etch stop layer (under layer) and/or an anti-reflective coating (ARC)/hard mask layer (top layer). FIG. 3 shows this coating 41 after it has been polished to produce a planar upper surface. The ILD coating provides a substrate on which to fabricate another layer of circuit elements. If the region to be filled between fins has a high aspect ratio (the ratio of the height of the fins to the distance between them), then voids can form during the process of depositing the ILD coating. Such a void is shown in FIG. 4 at 42. Additional processing steps are often employed to prevent the formation of such voids. For example, a partial ILD coating can be deposited and then etched to form trenches between fins with sloped walls. Then, a final coating is deposited that fills the trenches without forming voids. This dual-step approach causes additional process steps that add to the cost and decrease overall yield, however.

What is needed, therefore, is a mesa structure that allows for improved gate electrode formation, source/drain implantation, and ILD deposition.

SUMMARY OF THE INVENTION

The present invention provides a method of fabricating multiple-gate MOSFETs that reduces the need for overetching to remove the residue of subsequently deposited material from the fins of such transistors. Subsequently, coatings can be deposited with less variation in thickness over the surfaces of the fins using the techniques of the present invention. A more even level of doping between the tops and sidewalls of the fins can be achieved with traditional ion implantation angles by employing the present invention, which also reduces the need for additional steps in depositing an inter-layer dielectric coating.

In one aspect, the present invention provides for a transistor having a mesa formed in an active layer of a substrate. The mesa has a trapezoidal cross section and sidewalls that form an angle of from about 45 degrees to about 70 degrees to vertical. The transistor also includes first and second source/drain regions formed within the mesa and a channel region in the mesa interjacent the first and second source/drain regions. A gate dielectric overlies the channel region along the sidewalls and top of the mesa and a gate electrode overlies the gate dielectric.

In another aspect, the present invention provides for a method of forming a transistor. The method includes providing a substrate having an active layer and providing a mask on the substrate. The mask covers certain portions of the active layer and leaves certain portions exposed. The method further includes forming a mesa in the active layer by etching the exposed regions of the active layer in an oxygen containing plasma, whereby the resulting mesa has sidewalls having an interior angle, relative to vertical, of from about 45 degrees to about 70 degrees. The method further includes forming a dielectric layer over the resulting mesa, forming a polysilicon layer over the dielectric layer, and patterning the polysilicon layer to form a gate electrode. Dopants are implanted into select regions of the mesa to form source/drain regions on either side of the gate electrode.

In another aspect, the present invention provides for a method of forming a transistor comprising providing a substrate having an active layer and providing a mask on the substrate. The mask leaves certain regions of said active layer exposed. The method further includes forming a mesa in the active layer by etching the exposed regions of the active layer in a plasma etcher at a pressure of from about 20 mTorr to about 30 mTorr, with a top electrode power of about 750 W and a bottom electrode power of about 100 W, using HBr flowing at about 150 sccm, oxygen flowing at about 3 sccm, and chlorine flowing at about 50 sccm. The resulting mesa has sidewalls having an interior angle, relative to vertical, of from about 45 degrees to about 80 degrees. The method further includes forming a dielectric layer over the resulting mesa, forming a polysilicon layer over the dielectric layer, patterning the polysilicon layer to form a gate electrode, and implanting dopants into select regions of the mesa to form source/drain regions on either side of the gate electrode.

In yet another aspect, the present invention provides for an integrated circuit comprising a substrate, a buried oxide layer formed on said substrate, and an active layer formed on the buried oxide layer, the active layer having been formed into a series of mesas. Each mesa has a generally trapezoidal cross section and sidewalls that form an interior angle, relative to vertical, of less than 80 degrees. At least one mesa has first and second source/drain regions formed therein, a channel region formed therein interjacent the first and second source/drain regions, a gate dielectric formed over the channel region, and a gate electrode formed over the gate dielectric, the gate dielectric further overlying a second channel region formed in a second mesa.

As such, a multiple-gate transistor and method for fabricating such a transistor are described. The foregoing has outlined rather broadly the features of the present invention in order that the detailed description of the invention that follows may be better understood. Additional features of the invention will be described hereinafter which form the subject of the claims of the invention.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which like numbers indicate like features and wherein.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a MOSFET device having an active region with a trapezoidal cross-section. The invention may also be applied, however, to other semiconductor devices and other cross-sectional profiles.

Figure 1:
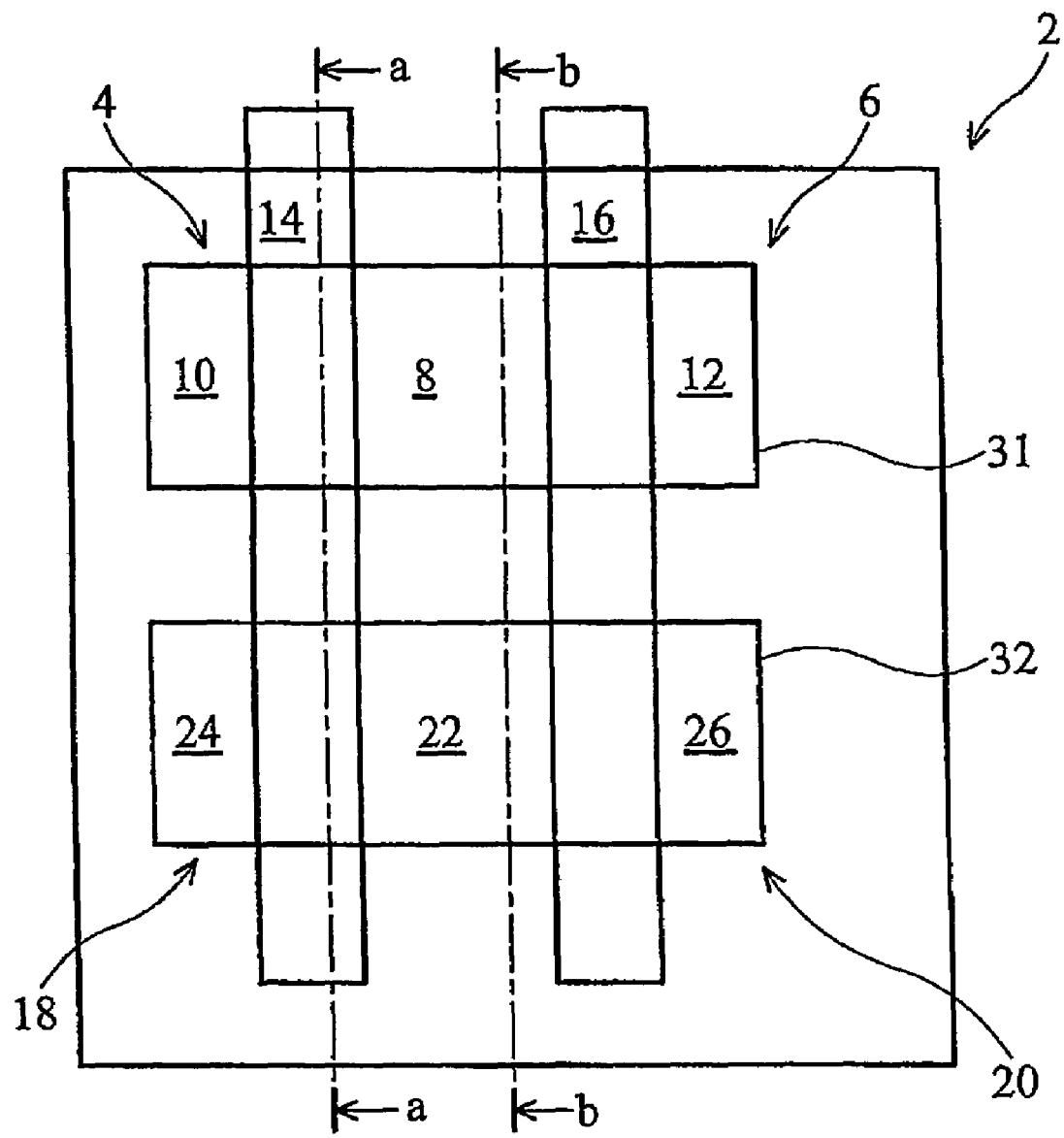
FIG. 1 is a plan view of a prior art structure.
Figure 2A:
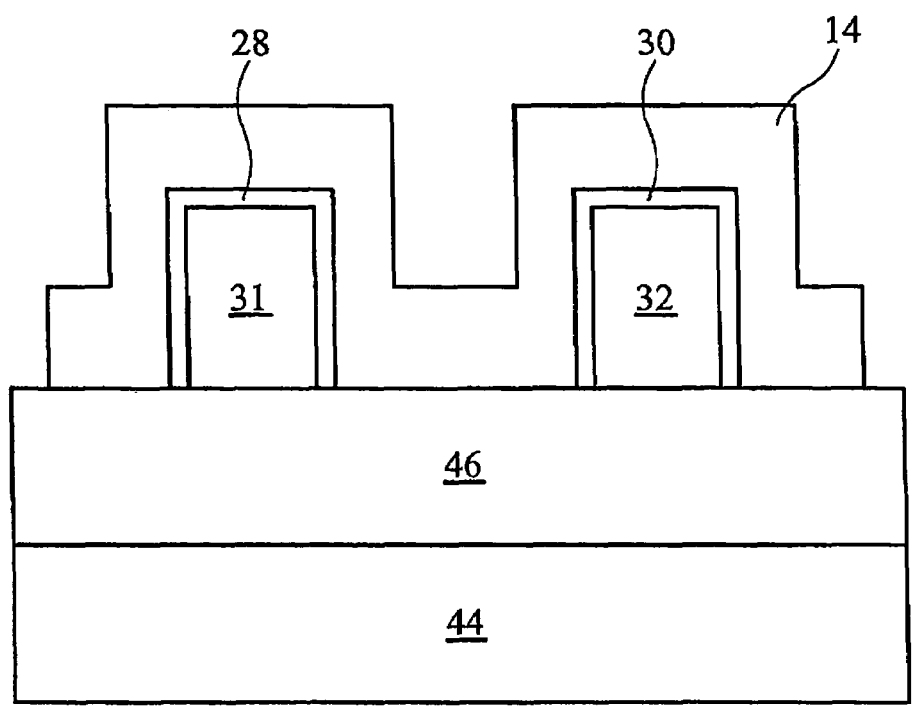
FIGS. 2a and 2b are cross-sections of the structure of FIG. 1.
Figure 2B:
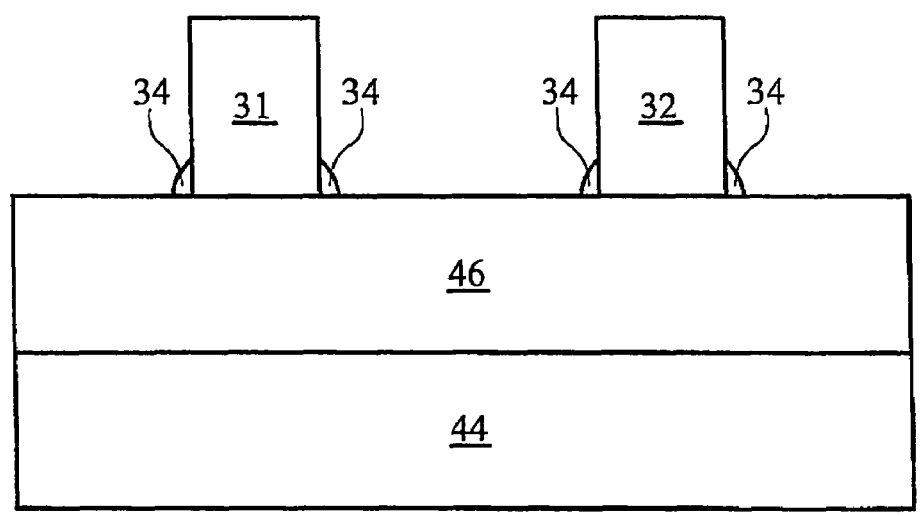
Figure 3:
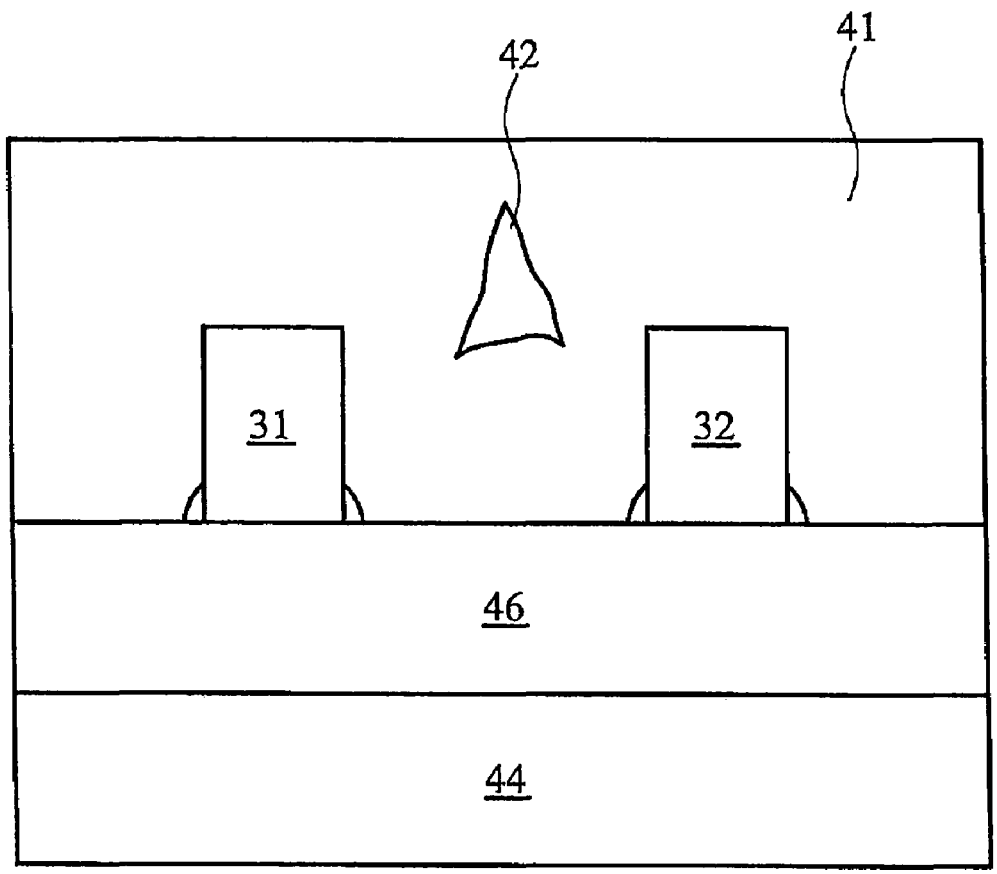
FIG. 3 is a cross-section of the prior art structure of FIG. 1 showing poor ILD coverage.
Figure 4:
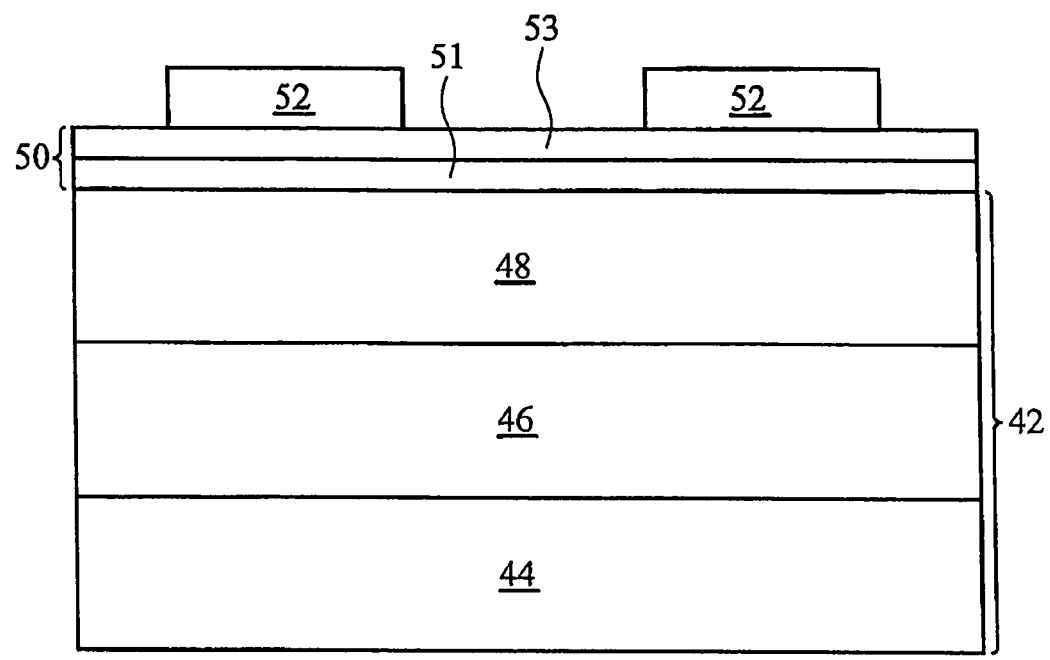
FIG. 4 is a cross-section of an SOI substrate which forms an intermediate structure in illustrative embodiments of the present invention.

FIG. 4 illustrates a cross-sectional view of a semiconductor substrate 42 that is employed in illustrative embodiments of the present invention. The SOI substrate 42 includes a substrate layer 44 (e.g., silicon, a silicon compound, glass, or quartz), an insulator layer 46 (e.g., a Buried OXide or BOX) and an active layer 48 (e.g., silicon, silicon-germanium, or some other semiconductor material or compound). Mesas 31 and 32 will be formed from active layer 48, as will be explained in greater detail below. Overlying active layer 48 is hard mask layer 50. Hard mask 50 is used in forming the mesas, as will be explained in greater detail below. Hard mask 50 is preferably a compound layer including a silicon oxide layer 51 and a silicon nitride layer 53. The thickness of the oxide layer 51 is preferably about 10 Å to about 200 Å. The thickness of the nitride layer 53 is preferably about 20 Å to about 1000 Å. The thickness of active layer 48 is preferably between about 200 Angstroms (Å) and about 1000 Å. This layer is preferably epitaxially grown from silicon, silicon germanium, germanium, or strained silicon. As illustrated in FIG. 4, a photoresist layer is deposited on top of the structure and patterned to form patterns 52. These patterns will be imparted onto active layer 48 to form mesas 54 and 56 (see FIG. 5).

Figure 5:
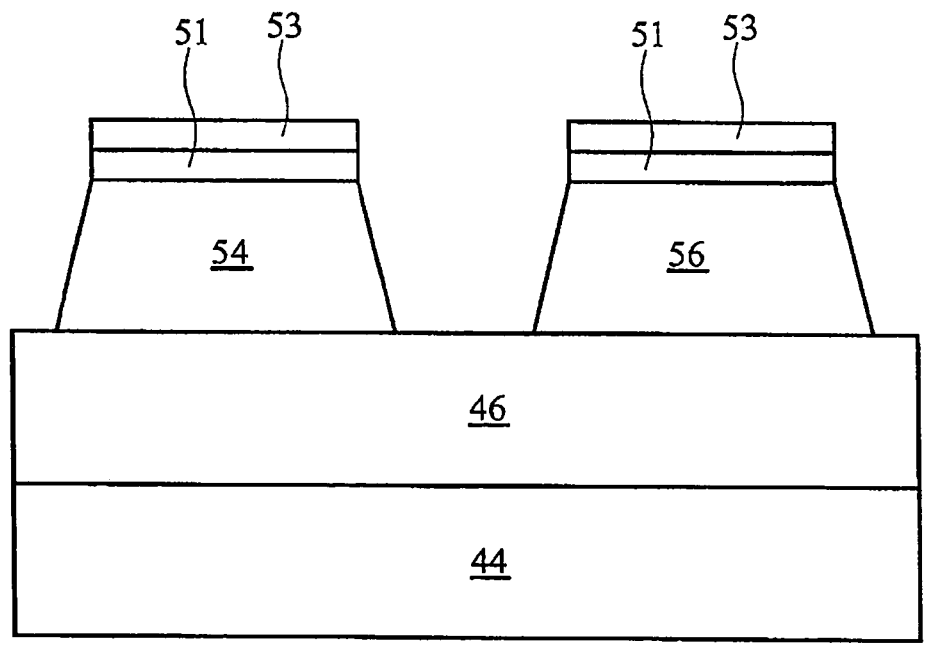
FIG. 5 is a cross-section of another intermediate structure of an illustrative embodiment of the present invention.

FIG. 5 illustrates the structure illustrated in FIG. 4 after mesas 54 and 56 have been formed (and after photoresist 52 has been removed). Formation of the mesas proceeds as follows. Hard mask 50 is first etched through, typically by an RIE or high density plasma and in-situ etch of both $Si_3N_4$ and oxide. Next, active layer 48 is etched through to form the mesas. Note that the mesas, e.g., mesas 54 and 56, have tapered profiles and sloped sidewalls.

A preferred etch process that produces a sidewall profile of approximately 45 degrees from the vertical will now be described. The device is placed in an RIE or high density plasma (dry etch) chamber and the chamber evacuated to around 60 to 70 mTorr. Approximately 750 W of power is applied to the upper electrode of the chamber and about 150 W of power is applied to the bottom electrode. HBr is introduced into the chamber at a flow rate of about 350 sccm. Oxygen is introduced into the chamber at about 200 sccm. For an active layer of 200 Angstroms, the etch time will be approximately 4 to 13 seconds. For an active layer of 1000 Angstroms, the etch time will be approximately 20 to 63 seconds.

If a more tapered profile is desired, this can be accomplished by adjusting one or more of the chamber pressure, bottom electrode power, or oxygen flow rate. Chlorine might also be introduced in order to increase the sidewall angle. Table 1 illustrates the effect of these parameters on the etch profile.

TABLE 1

|  | Vertical profile | taper profile | |
| --- | --- | --- | --- |
| Si angle | >80 degree | ~70 degree | ~45 degree |
| chamber pressure | 20~30 mT | 50~60 mT | 60~70 mT |
| Top power | 750 W | 750 W | 750 W |
| Bottom power | 100 W | 150 W | 300 W |
| Gas | | | |
| 1. HBr | 150 sccm | 350 sccm | 350 sccm |
| 2. He | X | 200 sccm | 200 sccm |
| 3. O2 | 3 sccm | 5~6 sccm | 7 sccm |
| 4. Cl | 50 sccm | X | X |
| Etch angle control factor for more taper profile | | | |
| 1. Higher pressure 2. Higher bottom power 3. More O2 gas | | | |

Figure 6A:
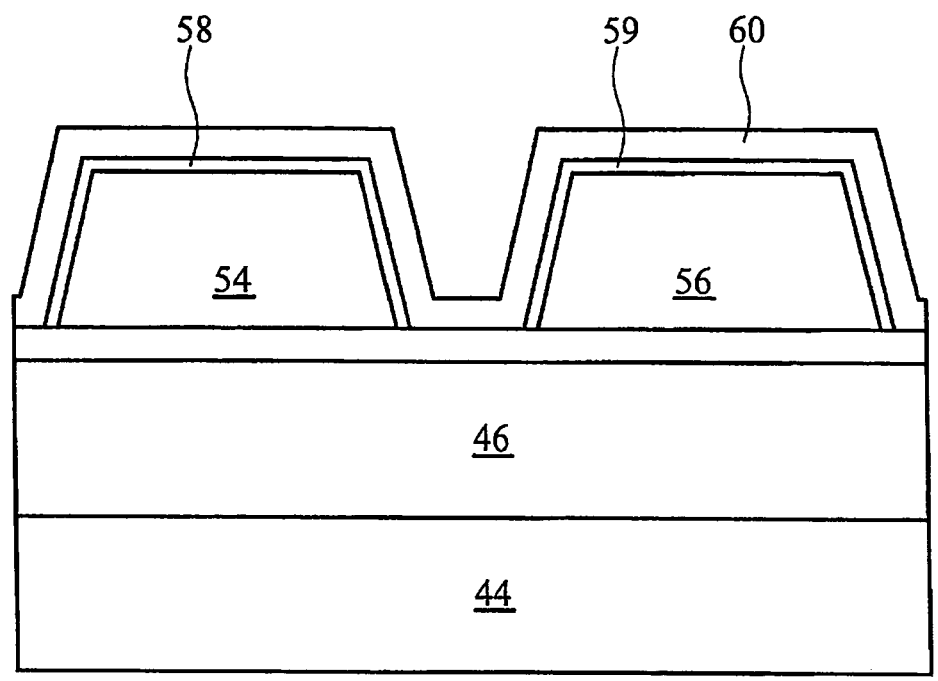
FIGS. 6a and 6b are cross-sections of portions of an intermediate structure of an illustrative embodiment of the present invention.
Figure 6B:
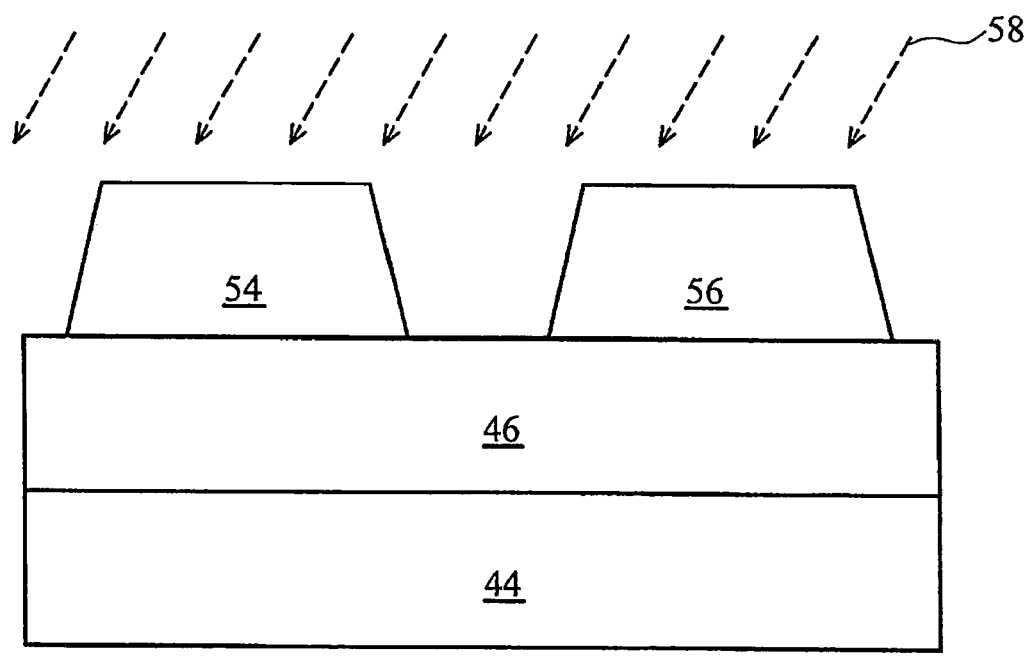

After formation of the tapered profile mesas, processing continues to form, e.g., transistors 4, 6, 18, and 20. Hard mask 50 is removed by a wet process, such as diluted $HF+H_3PO_4$ (for $Si_3N_4$). In the case where a sacrificial oxide has been formed, this oxide can be removed, such as by using diluted HF. After removal of the hard mask, a thin gate dielectric is formed over the surface of the device. This gate dielectric may be a thermally grown silicon oxide, or alternatively a high k gate dielectric, as is well known in the art. Next a polysilicon layer is blanket deposited over the structure and etched to form gate electrodes. This polysilicon layer can then be patterned to form gate electrodes, such as gate electrode 60 illustrated in FIG. 6a. FIG. 6a shows a cross-section of an illustrative embodiment in which mesas 54 and 56 have been formed using the above-described process steps to have tapered profiles and angled sidewalls. As illustrated, the gate dielectric layer has been patterned prior to formation of the polysilicon layer, in order to form gate oxides 58 and 59. In other embodiments, the gate dielectric layer may remain un-patterned and simply provide additional insulation below gate electrode 60. FIG. 6b illustrates the cross-sectional view of the structure over the common source/drain region. Note that the angled sidewalls allow for uniform removal of the polysilicon layer, resulting in an absence of polysilicon residuals.

FIG. 6b also illustrates the subsequent processing step of ion implanting the source/drain regions. Note that, due to the tapered profile of the mesas 54 and 56, the sidewalls of the mesas will receive a more uniform dose of the ions than would a vertically oriented sidewall. Note also that even for closely spaced mesas, the sloped sidewalls prevent, or at least minimize, the shadowing phenomena of the prior art. Prior to the step of ion implantation doping, the wafer may be annealed to repair any mechanical damage done to the surface of the active region by the etching process. Additionally, a sacrificial oxide may be formed on the exposed surfaces of the active region to minimize disruptions of the silicon matrix within the active region caused by the energetic ions. Alternatively, the sacrificial oxide may be formed before annealing the wafer to repair the etch damage. Because of the angle of the sidewalls, better doping of the sidewalls and less shadowing of adjacent active regions will result from the conventional process of ion implantation from a high angle. Solid-source diffusion doping efficiency of the sidewalls is also improved, in part due to the reduced sidewall thinning of the dopant coating.

Figure 7:
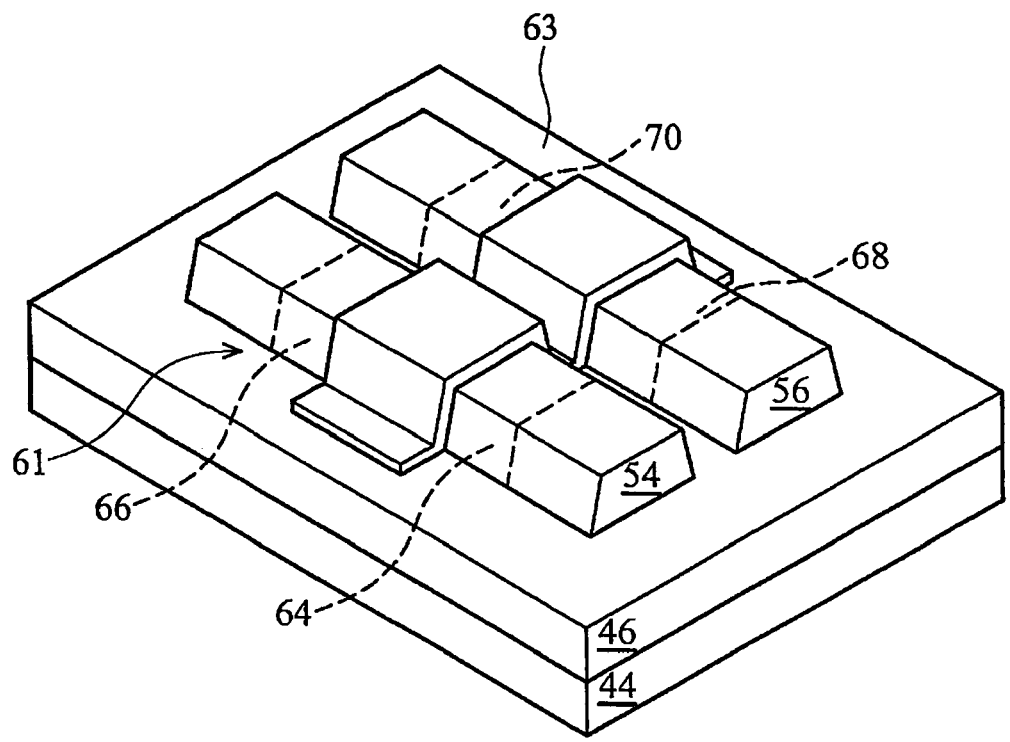
FIG. 7 is a perspective view of an illustrative circuit employing aspects of the present invention.
Figure 8:
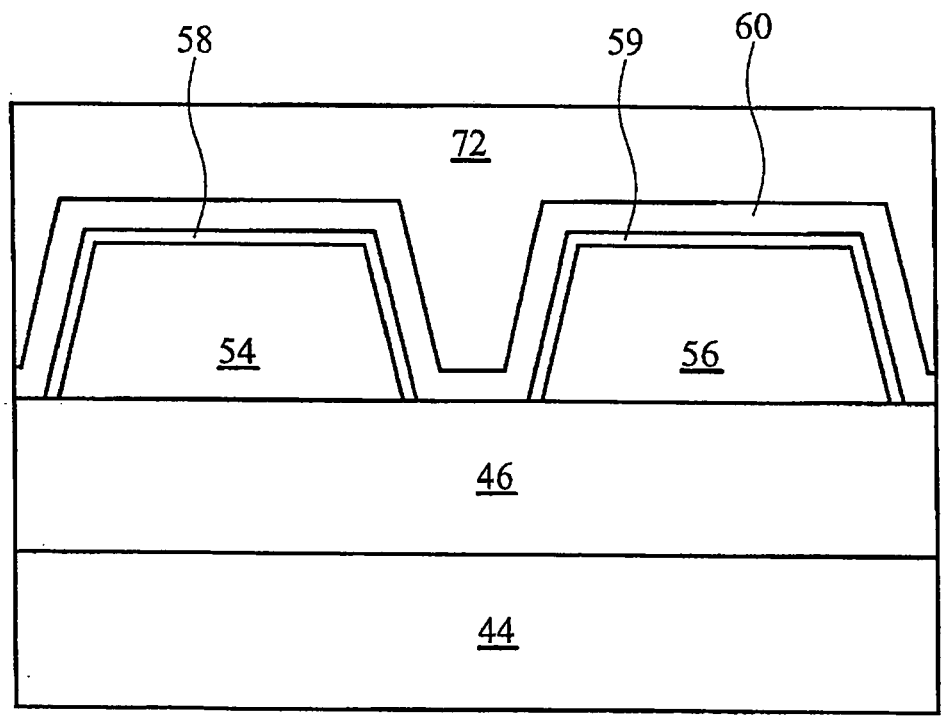
FIG. 8 is a cross-section of a device formed using aspects of the present invention.

FIG. 7 illustrates in orthogonal view an idealized circuit employing an illustrative embodiment of the present invention. A first transistor 61 is formed in tapered-profile mesa 54. Transistor 61 includes a first source/drain region 64, illustrated in dotted lines to show the impurity regions formed by doping selected regions of mesa 54, and a second source/drain region 66. Gate electrode 60 (not shown) overlies the channel region (not shown) that is in mesa 54, between source/drain regions 64 and 66. A second transistor 63 is formed in mesa 56, having source/drain regions 68 and 70. Gate electrode 60 (not shown) overlies the channel region (not shown) of transistor 63, which is formed in mesa 56 between source/drain regions 68 and 70. One skilled in the art will recognize that a gate dielectric underlies gate electrode 60. The tapered profile, angled sidewalls of mesas 54 and 56 allow for complete removal of polysilicon in the source/drain regions, as well as improved dopant concentration in the sidewalls of the mesas (at the source/drain regions). Finally, the sloped sidewalls of the mesas allow for more complete, void free formation of an ILD layer above the devices, as illustrated in FIG. 8. As shown, ILD layer 72 can easily fill in the space between even closely spaced mesas because of the tapered profile, without the formation of voids, keyholes, and the like.

While the figures and description have described a pair of transistors sharing a common gate, the present invention can also be embodied in a single transistor with an individual gate or in a greater number of transistors with a combination of individual and common gates. The present invention can also be embodied in other semiconductor devices whose active regions are raised from the surface of the wafer.

Although the present invention and its advantages have been described in detail, it should be understood that various changes, substitutions and alterations can be made herein without departing from the spirit and scope of the invention as defined by the appended claims. For example, the present invention can also be embodied in a single transistor with an individual gate or in a greater number of transistors with a combination of individual and common gates. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor comprising:
  a mesa formed in an active layer of a substrate, the mesa having a trapezoidal cross section and having sidewalls that form an angle from about 45 degrees to about 70 degrees to vertical;
  first and second source/drain regions formed within the mesa;
  a channel region in the mesa interjacent the first and second source/drain regions;
  a gate dielectric overlying the channel region along the sidewalls and a top surface of the mesa; and
  a gate electrode overlying the gate dielectric.

2. The transistor of claim 1 wherein one of said source/drain regions is shared with a second transistor.

3. The transistor of claim 1 wherein said mesa is formed from an active layer of a semiconductor on insulator (SOI) substrate.

4. The transistor of claim 1 wherein said active layer is formed of a material selected from the group consisting essentially of silicon, germanium, strained silicon, carbon, and combinations thereof.

5. The transistor of claim 1 wherein said mesa is between about 200 Angstroms and 1000 Angstroms in thickness.

6. The transistor of claim 1 wherein the top surface of said mesa has a width of about 200 Angstroms.

7. An integrated circuit comprising:
  a substrate;
  a buried oxide layer formed on said substrate; and
  an active layer formed on said buried oxide layer, the active layer having been formed into a series of mesas, each such mesa having a generally trapezoidal cross-section and having sidewalls that form an interior angle, relative to vertical, of less than 80 degrees;
  at least one of said mesas having:
    first and second source/drain regions formed therein;
    a channel region formed therein interjacent the first and second source/drain regions;
    a gate dielectric formed over the channel region; and
    a gate electrode formed over the gate dielectric, the gate dielectric further overlying a second channel region formed in a second mesa.

8. The integrated circuit of claim 7 wherein said gate electrode comprises polysilicon.

9. The integrated circuit of claim 7 wherein said interior angles are about 70 degrees.

10. The integrated circuit of claim 7 wherein said interior angles are about 45 degrees.

11. The integrated circuit of claim 7 further comprising:
  a third source/drain region formed in said at least one mesa;
  a second channel region formed interjacent said second and third source/drain regions;
  a second gate dielectric formed over the second channel region; and
  a second gate electrode formed over the second gate dielectric.

12. The integrated circuit of claim 11 wherein the gate dielectric and the second gate dielectric are formed in a single continuous dielectric layer.

13. A transistor comprising:
  a semiconductor on insulator (SOI) substrate;
  a mesa formed in an active layer of the SOI substrate, wherein the mesa has sidewalls forming an angle to vertical from about 45 degrees to about 70 degrees;
  first and second source/drain regions formed within the mesa;
  a channel region in the mesa interjacent to the first and second source/drain regions; and
  a gate region overlying the channel region along the sidewalls and a top surface of the mesa.

14. The transistor of claim 13 wherein said gate region comprises:
  a gate electrode deposited onto a gate dielectric layer, the gate dielectric layer formed over the channel region.

15. The transistor of claim 13 further comprising:
  a second transistor, wherein the second transistor shares the first and second source/drain regions.

16. The transistor of claim 13 wherein the mesa has a trapezoidal cross-section.

17. The transistor of claim 13 wherein the active layer is formed from a material selected from the group consisting essentially of:
  silicon;
  germanium;
  strained silicon;
  carbon; and
  a combination of one or more of: silicon, germanium, strained silicon, and carbon.

18. The transistor of claim 13 wherein the mesa has a thickness measuring between about 200 Angstroms and 1000 Angstroms.

19. The transistor of claim 13 wherein the top surface of the mesa has a width of about 200 Angstroms.

20. An integrated circuit comprising:
  a semiconductor on insulator (SOI) substrate;
  one or more mesas formed in an active layer of the SOI substrate, wherein each of the one or more mesas has a generally trapezoidal cross-section and sidewalls forming an interior angle to vertical of less than 80 degrees;
  first and second source/drain regions formed in at least one of the one or more mesas;
  a channel region formed interjacent to the first and second source/drain regions;
  a gate region formed over the channel region, wherein the gate region overlies a second channel region formed in a second of the one or more mesas.

21. The integrated circuit of claim 20 wherein said gate region comprises:
   a gate dielectric deposited over the channel region and the second channel region; and
   a gate electrode formed over the gate dielectric.

22. The integrated circuit of claim 21 wherein said gate electrode comprises polysilicon.

23. The integrated circuit of claim 20 wherein said interior angles comprise one of:
   about 70 degrees; and
   about 45 degrees.

24. The integrated circuit of claim 20 further comprising:
   a third source/drain region formed in the one or more mesas;
   a second channel region formed interjacent the second and third source/drain regions;
   a second gate dielectric formed over the second channel region, said second gate dielectric having a second gate electrode formed thereon.

25. The integrated circuit of claim 24 wherein a gate dielectric of the gate region and the second gate dielectric are formed in a single continuous dielectric layer.

* * * * *